(12) United States Patent
Tanikawa et al.

(10) Patent No.: US 7,386,407 B2
(45) Date of Patent: Jun. 10, 2008

(54) SEMICONDUCTOR DEVICE TEST METHOD USING AN EVALUATION LSI

(75) Inventors: Yukihiko Tanikawa, Tokyo (JP); Hajime Matsuzawa, Tokyo (JP)

(73) Assignee: NEC Corporation, Tokyo (JP)

( * ) Notice: Subject to any disclaimer, the term of this patent is extended or adjusted under 35 U.S.C. 154(b) by 18 days.

(21) Appl. No.: 11/373,500

(22) Filed: Mar. 13, 2006

(65) Prior Publication Data
US 2006/0224347 A1 Oct. 5, 2006

(30) Foreign Application Priority Data
Mar. 14, 2005 (JP) .............................. 2005-070897

(51) Int. Cl.
*G06F 19/00* (2006.01)
(52) U.S. Cl. ............................ 702/69; 702/81; 702/189
(58) Field of Classification Search .................. 702/69, 702/81, 117, 176, 189; 324/765, 158, 1.1, 324/76.39, 613, 620, 621, 622, 763; 714/718, 714/30, 25, 814, 744, 707; 365/201; 257/48; 438/14; 368/118–120
See application file for complete search history.

(56) References Cited

U.S. PATENT DOCUMENTS

| | | | | |
|---|---|---|---|---|
| 4,800,564 A | * | 1/1989 | DeFazio et al. ............ 714/814 |
| 5,577,086 A | * | 11/1996 | Fujimoto et al. ........... 375/376 |
| 5,883,521 A | * | 3/1999 | Nishikawa .................. 324/765 |
| 6,323,668 B1 | * | 11/2001 | Hashimoto .................. 324/763 |
| 6,487,682 B2 | * | 11/2002 | Yamamura et al. ........... 714/30 |
| 7,085,675 B2 | * | 8/2006 | Wegerich .................... 702/181 |
| 7,162,671 B2 | * | 1/2007 | Hasegawa et al. .......... 714/718 |

FOREIGN PATENT DOCUMENTS

JP 2000-097996 4/2000

OTHER PUBLICATIONS

Nakamura et al., 'PLL Timing Design Technique for Large-Scale, High-Speed, and Low-Cost SRAMs.', 1994, IEEE Publicaiton, pp. 559-562.*

* cited by examiner

*Primary Examiner*—Eliseo Ramos-Feliciano
*Assistant Examiner*—Elias Desta
(74) *Attorney, Agent, or Firm*—Foley & Lardner LLP

(57) ABSTRACT

An evaluation LSI includes a noise generation circuit generating a controlled amount of noise controlled from outside of the LSI, and a delay measurement circuit measuring a signal delay of a delay circuit influenced by the noise. The relationship between the amount of noise and the signal delay is determined. A device-under-test (DUT) LSI includes a functional circuit and a delay circuit having a signal delay influenced by the operation of the functional test. By evaluating the signal delay of the delay circuit in the DUT LSI, the amount of noise therein is estimated based on the determined relationship.

9 Claims, 8 Drawing Sheets

SEMICONDUCTOR DEVICE TEST METHOD USING AN EVALUATION LSI

BACKGROUND OF THE INVENTION

1. Field of the Invention

The present invention relates to a semiconductor device test method using an evaluation LSI and, more specifically, to a semiconductor device test method of measuring the amount of noise generated in a semiconductor device.

The present invention also relates to technique for testing whether or not the oscillation period of clock signal is within a predetermined range.

2. Description of the Related Art

LSIs have been developing in recent years, to attain a higher-speed operation and a higher integration. This development has involved the problem of erroneous operation due to the internal noise of LSIs. Hence, evaluation of influence of internal noise of LSIs has become more significant. Internal noise of LSIs is conventionally evaluated as follows. Power source pins and ground pins, for example, are formed as monitoring package pins connected to internal pads in the LSI. A probe is used for the monitoring pins, and monitoring is carried out by use of an oscilloscope or the like receiving test result signals from the probe. That is, internal noise of the LSI is evaluated by directly measuring the noise inside the LSI. Also in case of testing oscillation condition of a clock generation circuit, a monitoring pin is provided, and a clock signal is monitored by an oscilloscope or the like.

A technique concerning a semiconductor test device is described in Patent Publication JP-A-2000-97996. FIG. 8 shows the configuration of the clock-period monitoring circuit described in this publication. The clock-period monitoring circuit is used to detect an input clock signal having an oscillation period shorter than a reference period. The delay time of a fixed-delay circuit 52 is set equal to a width of a clock pulse during which the clock signal assumes a H-level. The delay time of a variable-delay circuit 54 is set equal to a value expressed by the reference period minus double the delay time of the fixed-delay circuit. Assume, for example, the case of detecting that pulse width of the clock signal is 4 ns (nanosecond) and the oscillation period of the clock signal has decreased to 24 ns or lower. In this case, the delay time of the fixed-delay circuit 52 is set at 4 ns, and the delay time of the variable-delay circuit 54 is set at (24 ns−4 ns×2)=16 ns.

A flip-flop 51 shifts the output signal 51A thereof to a H-level in synchrony with a pulse of the clock signal. The fixed-delay circuit 52 delays the output signal 51A of the flip-flop 51, and outputs a signal 53A through a gate circuit 53. An AND gate 56 outputs a logical product of the clock signal and the output signal 53A of the fixed-delay circuit 52. The variable-delay circuit 54 further delays the signal 53A output form the fixed-delay circuit 52, and outputs a signal 54A. A clock terminal of the flip-flop 51 is fed with the output signal 54A of the variable-delay circuit 54. When the signal 54A shifts to a H-level, a signal of L-level is then output. The output signal 51A which has thus shifted to a L-level is delayed by the fixed-delay circuit 52, and is further input to one of input terminals of the AND gate 56 through the gate circuit 53.

Consideration will now be taken in the case that two consecutive pulses of the clock signal are input thereto. Upon input of the first pulse, the output signal 51A of the flip-flop 51 shifts to a H-level. This output signal 51A is delayed during a H-level period of the clock signal in the fixed-delay circuit 52. Therefore, both of inputs to the AND gate 56 cannot assume a H-level at a time. The flip-flop 51 outputs the output signal 51A at a L-level after the delay time of the fixed-delay circuit 52 plus the delay time of the variable-delay circuit 54, i.e., the reference period minus the delay time of the fixed-delay circuit 52 is elapsed since the time instant at which the first pulse of the clock signal is input. This output signal 51A is delayed by the fixed-delay circuit 52, and input to one of the input terminals of the AND gate 56. By this operation, the signal 53A input to the one of the input terminals of the AND gate 56 shifts to a L-level after a time period corresponding to the reference period is elapsed since the time instant at which the first pulse of the clock signal is input.

If the period of the clock signal is longer than the reference period, the output signal 53A of the fixed-delay circuit 52 assumes a L-level when the second pulse of the clock signal is input. Thus, both inputs to the AND gate 56 cannot assume a H-level at a time. On the other hand, if the period of the clock signal is shorter than the reference period, the second pulse of the clock signal is input before the signal 53A shifts to a L-level. Therefore, the AND gate 56 outputs a signal at a H-level. According to this operation, the clock-period monitoring circuit 50 outputs a defective-clock detection signal if the period of the clock signal exceeds the period corresponding to the maximum operation frequency in a specific mode of test. The publication JP-A-2000-97996 recites that execution of tests can be prevented by using the clock-period monitoring circuit under the condition that the clock signal input to the semiconductor device being tested (DUT: Device Under Test) exceeds the predetermined value.

In the conventional test method, internal lines are connected to external terminals, and probes are used for the external terminals to measure the noise inside the semiconductor device. However, as LSIs have achieved a higher speed, accurate measurement of noise inside the semiconductor device have become difficult due to various factors such as LSI package noise, accuracy of measurement devices, etc. Also in case of inspecting oscillation condition of a clock generation circuit by providing a monitoring pin, the higher speed causes difficulties in accurate measurement.

There may be considered another method of inputting a reference clock or sampling clock to a semiconductor device, without providing the monitoring pin during testing the clock signal. In this case, however, a problem arises in that the LSI has a complicated structure because circuits for generating those clocks and external connection pins for inputting the clocks to the semiconductor device must be further provided.

In the technique of JP-A-2000-97996, the clock signal input to the semiconductor device is monitored by the clock-period monitoring circuit 50. If the period of the clock signal is shorter than the predetermined period, the failure of the clock signal is detected. In this publication, however, the clock-period monitoring circuit 50 is used to prevent erroneous operation of a semiconductor test device, i.e., the circuit 50 merely detects a state that the period of the clock signal is shorter than the predetermined period. If the period of the clock signal is longer, the failure of the clock signal cannot be detected.

SUMMARY OF THE INVENTION

It is an object of the present invention to provide a semiconductor device test method and a semiconductor device capable of eliminating the problems described above of the prior art and accurately measuring the amount of noise even if the semiconductor device operates at a higher speed.

It is another object of the present invention to provide a semiconductor device test method and a semiconductor device capable of inspecting oscillation condition of a clock signal generated by a clock generation circuit, without the need of extracting the clock signal through an external connection pin and without necessitating a reference clock, a sampling clock, or the like.

The present invention provides, in a first aspect thereof, a method for testing a semiconductor device including: determining a relationship between an amount of noise generated in a noise generation circuit and a signal delay of a first delay circuit measured by a first delay measurement circuit in an evaluation semiconductor device (LSI), the noise generation circuit capable of generating a controlled amount of noise controlled from outside of the evaluation LSI, the first delay circuit having a delay time influenced by noise generated by the noise generation circuit; measuring a signal delay of a second delay circuit by using a second delay measurement circuit in a device-under-test (DUT) LSI having a functional circuit upon operation of the functional circuit of the DUT LSI, the second delay circuit having a signal delay influenced by the functional circuit, the DUT LSI and the evaluation ISI being manufactured in a common process condition: and evaluating an amount of noise generated in the DUT LSI based on the relationship determined in the determining step and the signal delay detected by the second delay measurement circuit.

In accordance with the method of the first aspect of the present invention, the amount of noise generated in the DUT LSI can be evaluated based on the signal delay measured by the second delay measurement circuit in the DUT LSI and the relation between the amount of noise and the signal delay measured by the first delay measurement circuit in the evaluation LSI. This allows the amount of noise to be evaluated without directly evaluating the amount of noise in the DUT LSI.

The present invention provides, in a second aspect thereof, a method for testing a clock signal, including: generating a test signal in response to a first clock pulse of the clock signal, to feed the test signal to first and second latch gates through data terminals thereof after providing first and second delays, respectively, to the test signal; feeding a second clock pulse of the clock signal succeeding to the first clock pulse to the first and second latch gates through control terminals thereof, thereby allowing the first and second latch gates to latch the test signal delayed by the firs and second delays, respectively; and investigating outputs of the first and second latch gates to judge pass or fail for an oscillation period of the clock signal.

The present invention provides, in a third aspect thereof, a semiconductor device including: a test signal generation circuit for receiving a first clock pulse of a clock signal to generate a test signal; first delay gate for providing a first delay to the test signal, the first delay corresponding to an allowable shortest period of the clock signal; a second delay gate for providing a second delay to the test signal, the second delay corresponding to a difference between an allowable longest period of the clock signal and the allowable shortest signal; a first latch gate for latching an output of the first delay gate at a timing of a second clock pulse of the clock signal succeeding to the first clock pulse; a second latch gate for latching an output of the second delay gate at the timing of the second clock pulse; and a judgement circuit for judging a period of the clock signal based on outputs of the first and second latch gates.

In accordance with the second and third aspects of the present invention, if the oscillation period of the clock signal is within an allowable range, the first latch gate latches the second clock pulse in synchrony with the delayed first clock pulse, whereas the second latch gates cannot latch the second clock pulse in synchrony with the delayed first clock pulse. Investigation of the outputs of the latch gates allows evaluation of the oscillation period of the clock signal, without directly inspecting the clock signal from outside the LSI.

In the semiconductor device test method according to the first aspect of the present invention, the amount of noise can be measured without observing noise generation condition inside the DUT LSI directly from outside. Accordingly, even if the speed of the semiconductor device rises higher, the amount of noise can be measured properly.

In the semiconductor device test method and semiconductor device according to the second and third aspects of the present invention, whether or not the clock signal is acceptable can be determined without directly observing the clock signal in the semiconductor device from outside. Accordingly, even if the speed of the semiconductor device rises higher, whether or not the clock signal is acceptable can be determined properly.

DETAILED DESCRIPTION OF THE PREFERRED EMBODIMENTS

Embodiments of the present invention will now be specifically described below with reference to the drawings.

Figure 1:
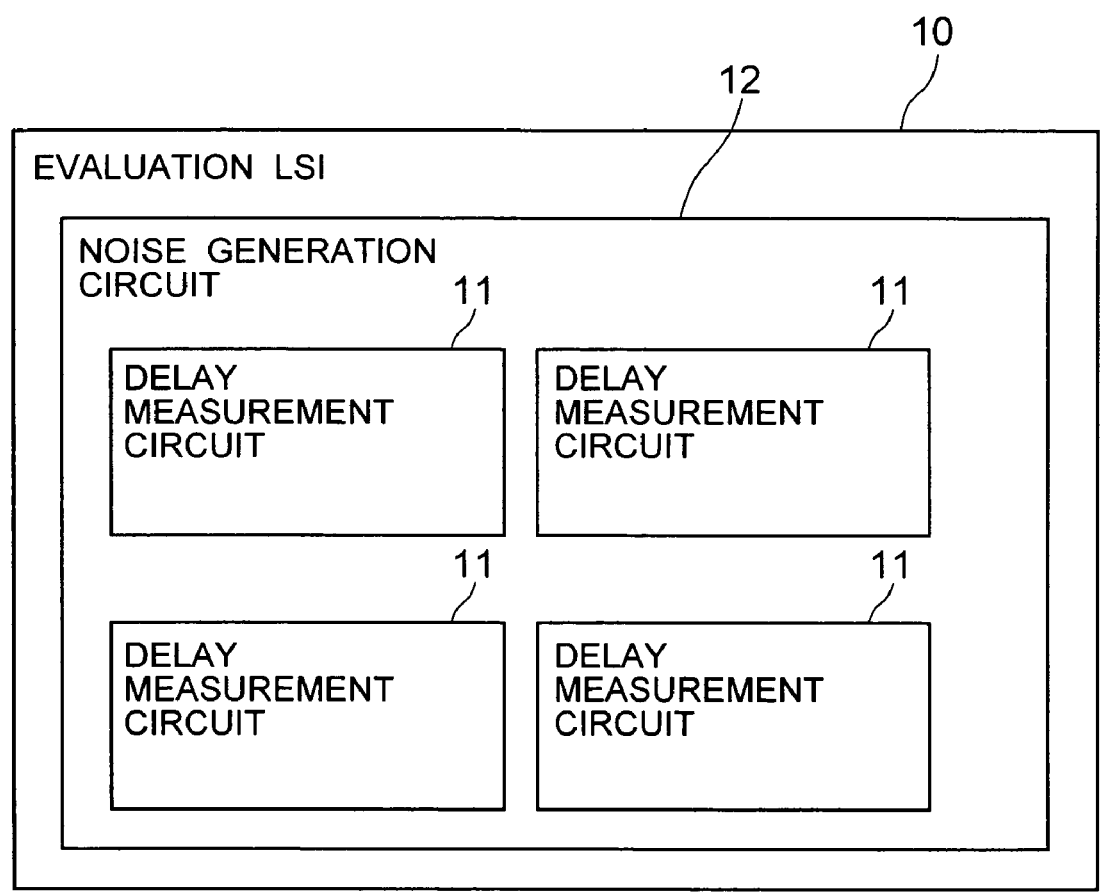
FIG. 1 is a block diagram showing the configuration of an evaluation LSI used in a semiconductor device test method according to a first embodiment of the present invention.

FIG. 1 shows the configuration of an evaluation LSI used in a method of testing a semiconductor device, according to a first embodiment of the present invention. The evaluation LSI 10 includes a plurality of delay measurement circuits 11 and a noise generation circuit 12, in which the delay measurement circuits 11 are installed. In the present embodiment, the evaluation LSI 10 having this kind of configuration is used in advance to determine the relationship between the amount of noise and the signal delay time measured by the delay measurement circuits 11. Then, a signal delay time is measured for a semiconductor device as a product under test (DUT LSI), to estimate the amount of noise generated in the DUT LSI.

The evaluation LSI 10 is manufactured in the same process condition as that of manufacturing the DUT LSI, and operates on the same or similar operation voltage as the DUT LSI as well. The noise generation circuit 12 is configured as a noise generation source that can be operated to generate a controlled amount of noise controlled from the outside. A plurality of flip-flops cascaded to one another in a variable number of cascade stages can be used as the noise generation circuit 12. The delay measurement circuit 11 is provided within the evaluation LSI 10 and measures a signal delay time. The delay measurement circuit 11 is formed on the same substrate as the noise generation circuit 12. The delay measurement circuit 11 is configured as a circuit which measures a signal propagation time which varies depending on the amount of noise.

Figure 2:
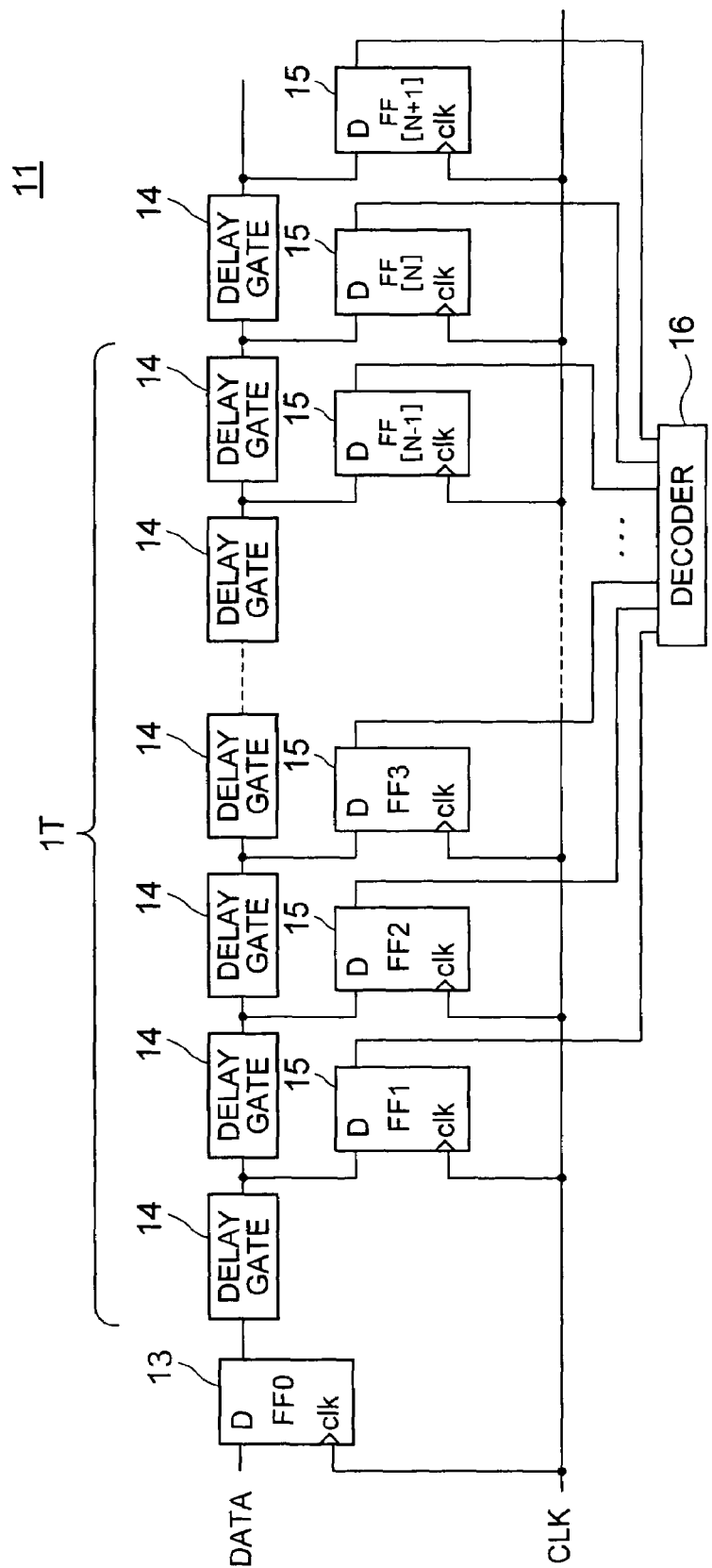
FIG. 2 is a block diagram showing the configuration of the delay measurement circuit shown in FIG. 1.

FIG. 2 shows the configuration of the delay measurement circuit 11. The delay measurement circuit 11 includes a flip-flop (FF0) 13 as a data transfer source, (N+1) delay circuits 14 (where N is an integer not smaller than 2) cascaded to one another, (N+1) flip-flops (delay measurement FF) 15, and a decoder 16. Each of the delay circuits 14 delays an input signal by a predetermined time length and outputs the delayed signal. The delay time of each delay gate 14 is set at T/N seconds [s] where the period of the clock signal is T [s]. For each delay gate 14, two cascaded inverters are used as delay elements therein in this example.

The data transfer source FF0 (13) outputs a signal (data) input to a data terminal (D), to the delay circuits 14, in synchrony with a rising edge of the clock signal input to the clock input (clk). Data terminals of delay measurement FFs 15 are connected to outputs of the respective delay circuits 14. For example, the delay measurement FF [2] (15) provided in the second stage is connected to the output of the delay gate 14 provided in the second stage as well. As a result, the data input terminal of each delay measurement FF 15 is fed with the output of the data transfer source FF0 (13) delayed by a product of the sequential stage number of the corresponding delay gate 14 by the delay time of each delay gate 14. Each delay measurement FF (15) receives therein the signal input to the data terminal, in synchrony with a rising edge of the clock signal, to output the received signal. The decoder 16 is fed with the output of each delay measurement FF (15), and counts the number of delay measurement FFs 15 which have been able to receive therein data output from the data transfer source FF0 (13).

Figure 3:
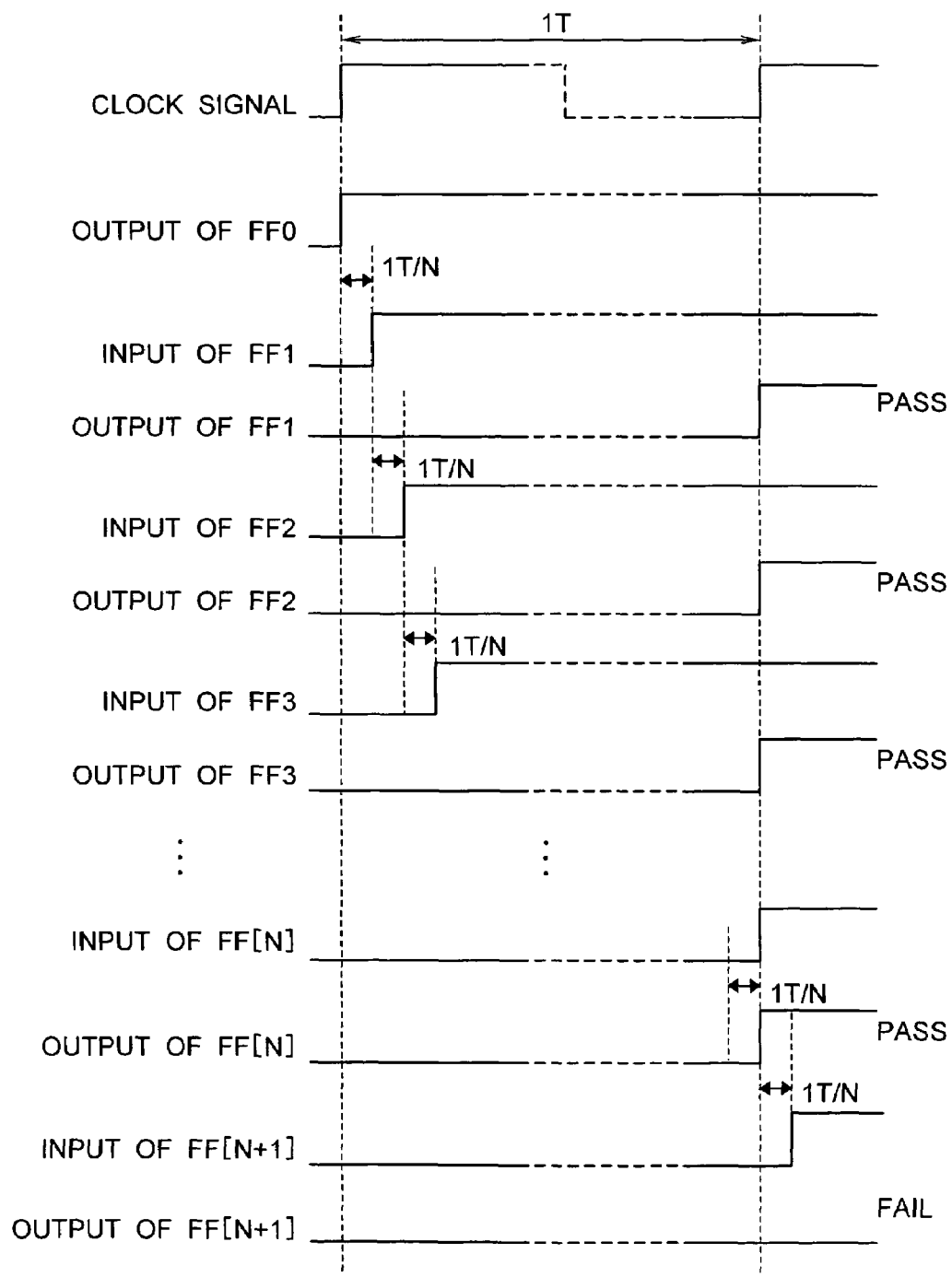
FIG. 3 is a timing chart showing operation of each gate in the delay measurement circuit.

FIG. 3 is a timing chart showing the operation of each gate of the delay measurement circuit 11 shown in FIG. 2. The data transfer source FF0 (13) changes the output level thereof to, for example, a H-level in synchrony with a rising edge of the clock signal. If influence of noise is not considered, for example, the level of the data terminal of a delay measurement FF[N] (15) in the N-th stage changes to a H-level at a timing delayed by N×(1T/N)=1T [s] from the timing of a rise of the clock signal, as shown in FIG. 3. The level of the data terminal of another delay measurement FF[N+1] (15) in the (N+1)-th stage changes to a H-level at a timing delayed by (N+1)×(1T/N) [s] from the timing of the rise of the clock signal.

In FIG. 3, during a single period 1T of the clock signal, the output of the data transfer source FF0 (13) is transferred to the delay measurement FF[N] (15) in the N-th stage. Therefore, if each of the delay measurement FFs 15 receives therein data at the timing of the next rise of the clock signal, the delay measurement FFs 15 up to the N-th stage FF [N] change their outputs to a H-level. At this timing of the next rise of the clock signal, however, the output of the data transfer source FF0 (13) has not yet been transferred to the data terminal of the delay measurement FF 15 in the (N+1)-th stage. Thus, the delay measurement FF[N+1] (15) in the (N+1)-th stage does not change the output thereof.

Figure 4:
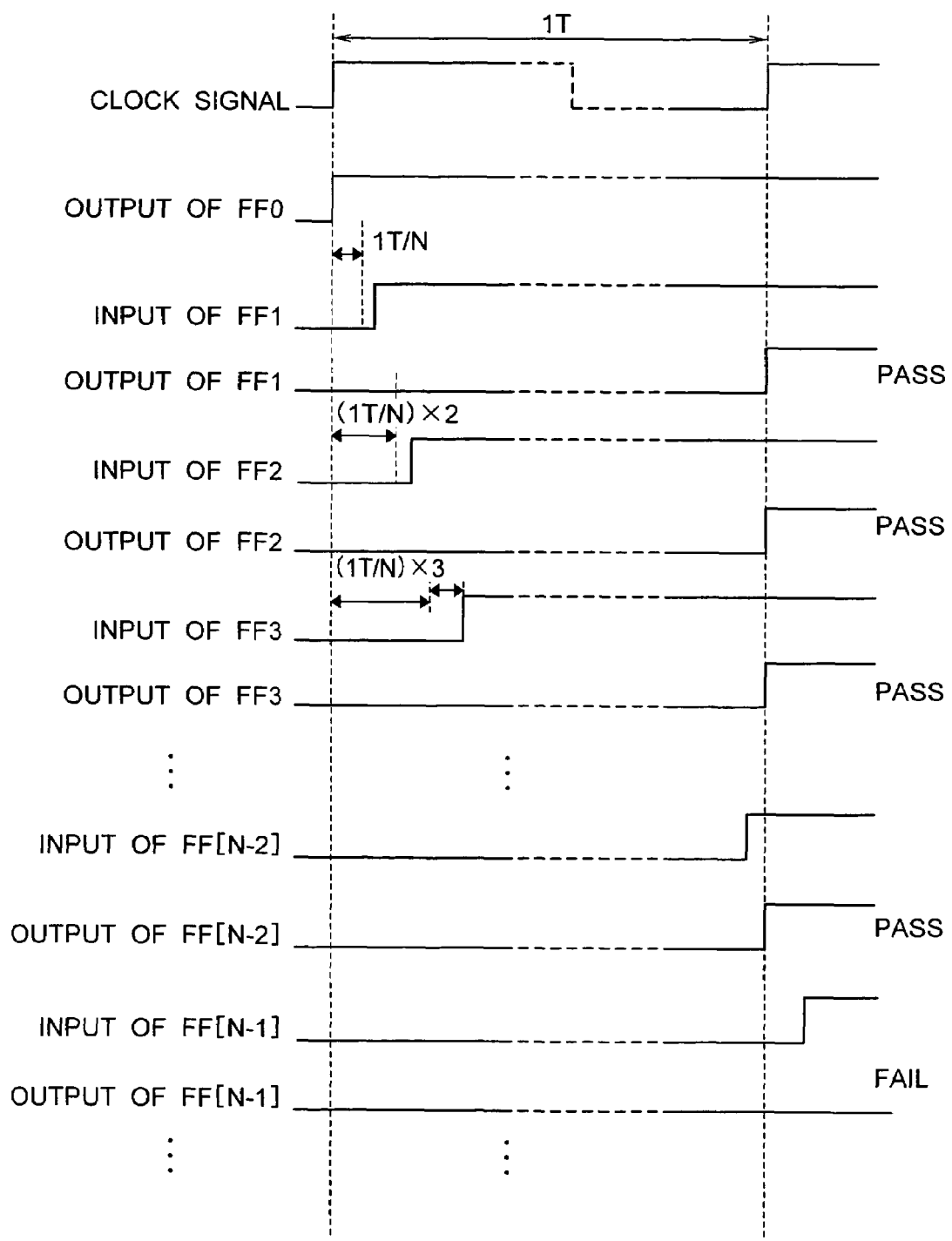
FIG. 4 is a timing chart showing the operation of each gate in the delay measurement circuit in the case wherein the delay time has increased due to the influence of noise.

On the other hand, if noise causes a significant influence, the delay time of the delay circuits 14 will be longer than a design value 1T/N. As the delay time of each delay gate 14 increases, increases are accumulated so that a time instant when the output of the data transfer source FF0 (13) reaches a delay measurement FF 15 is delayed to be later than a design value which is equal to a product of the sequential stage number by 1T/N. FIG. 4 shows this situation. In this figure, the increase in the delay time causes the output of the data transfer source FF0 (13) to be transferred only up to the delay measurement FF[N−2] (15) in the (N−2)-th stage during a single period 1T of the clock signal. In this state, if each delay measurement FF 15 receives therein data at timing of a rise of the clock signal, the delay measurement FFs 15 up to the (N−2)-th stage FF[N−2] change outputs thereof to a H-level although the other delay measurement FFs 15 in the stages subsequent to the (N−1)-th stage do not change the output thereof.

As described above, the number of stages of the delay measurement FFs 15 to which the output of the data transfer source FF0 (13) is transferred during a single a single period of the clock signal varies in accordance with a change in the delay time. Therefore, the signal delay time can be determined or measured by counting the number of those delay measurement FFs 15 that have been able to accurately receive therein the output of the data transfer source FF0 (13), with use of the decoder 16.

Meanwhile, a proportional relationship has been known to exist between the amount of noise and the signal delay time. Suppose that two LSIs have been manufactured through the same process and have the same operation voltage. Then, the proportional relationship between the amount of noise and the signal delay time are considered to be kept substantially intact even if both the LSIs have different circuit areas and different internal circuit configurations. In the present embodiment, the amount of noise generated in the noise generation circuit 12 can be changed in the evaluation LSI 10. With respect to each of changed amounts of noise, a signal delay time is measured by using the delay measurement circuit 11. From measured results, a proportionality coefficient between the amount of noise and the signal delay time is obtained and is used in the ISI test. For example, if the evaluation LSI 10 has four delay measurement circuits 11 as shown in FIG. 1, proportionality coefficients are obtained by using the respective delay measurement circuits 11, and the maximum one of the proportionality coefficients is used to conduct the test of the DUT LSIs. Alternatively, the proportionality coefficients obtained by the four delay measurement circuits 11 can be averaged, and the average of the coefficients can be used for the LSI test.

Figure 5:
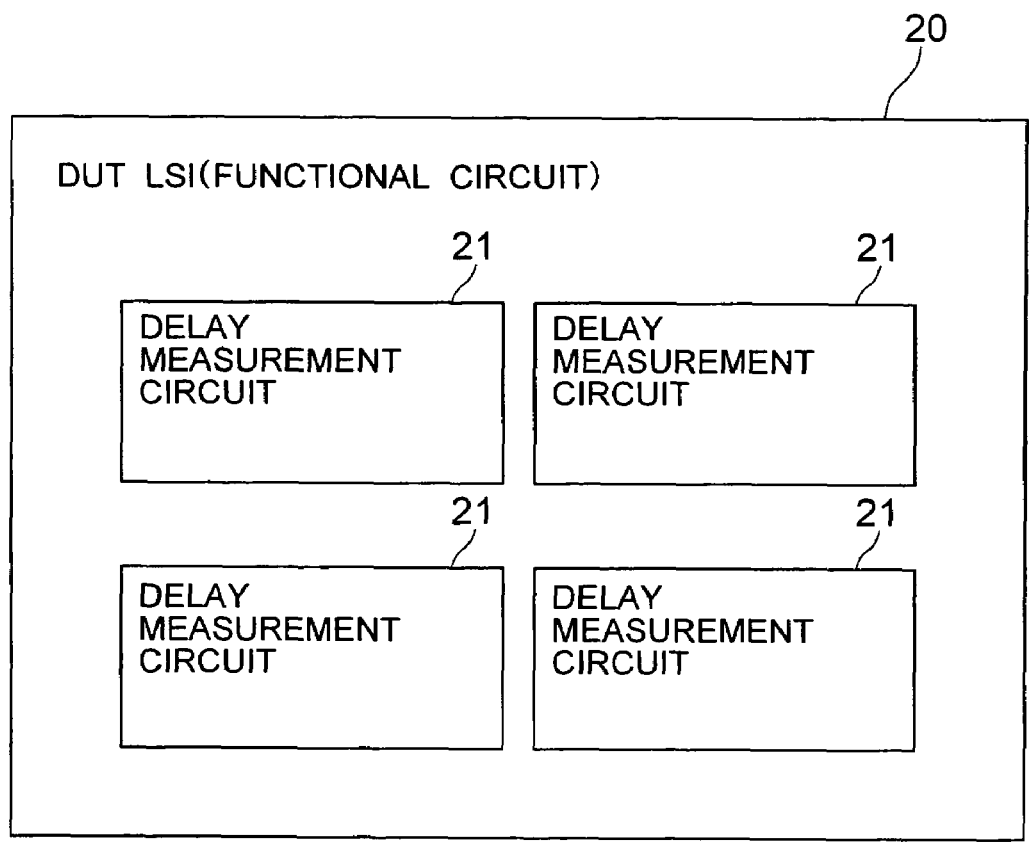
FIG. 5 is a block diagram showing a semiconductor device (LSI) as a product under test.

FIG. 5 shows the configuration of a semiconductor device (LSI) to be tested as a product under test (DUT LSI). The DUT LSI 20 includes, in addition to a functional circuit not shown, one or a plurality of delay measurement circuits 21 each having the same configuration as the delay measurement circuits 11 provided in the evaluation LSI 10 (FIG. 2). In a test of the DUT LSI 20, the functional circuit is set in operating condition. The number of those delay measurement FFs 15 that have been able to receive therein data of the data transfer source FF0 (13) is counted by a delay measurement circuit 21, to measure the delay time. The signal delay time measured by the delay measurement circuit 21 is responsive to the amount of noise generated in the DUT LSI 20. Thereafter, the signal delay time measured by the delay measurement circuit 21 in the DUT LSI 20 is multiplied by a proportionality coefficient determined with use of the evaluation LSI 10, to estimate the amount of noise in the DUT LSI 20.

In the present embodiment, the amount of noise is evaluated or estimated by investigating the output of each delay measurement FF 15 of the delay measurement circuit 21, as described above. Therefore, the amount of noise in the DUT LSI 20 can be determined without directly monitoring internal operation condition by connecting an internal interconnect to an external connection pin and by using a probe or the like on the pin. Thus, no specific or dedicated pin for monitoring the noise is necessary, and thus semiconductor devices can be manufactured at a lower cost since the number of pins can be reduced. The absence of monitoring pin allows the amount of noise inside the semiconductor device to be measured without receiving the influence from LSI package noise, inaccuracy of measurement devices, and the like. As a result, even if semiconductor devices have a higher operation speed, the amount of noise can be measured with a superior accuracy.

Figure 6:
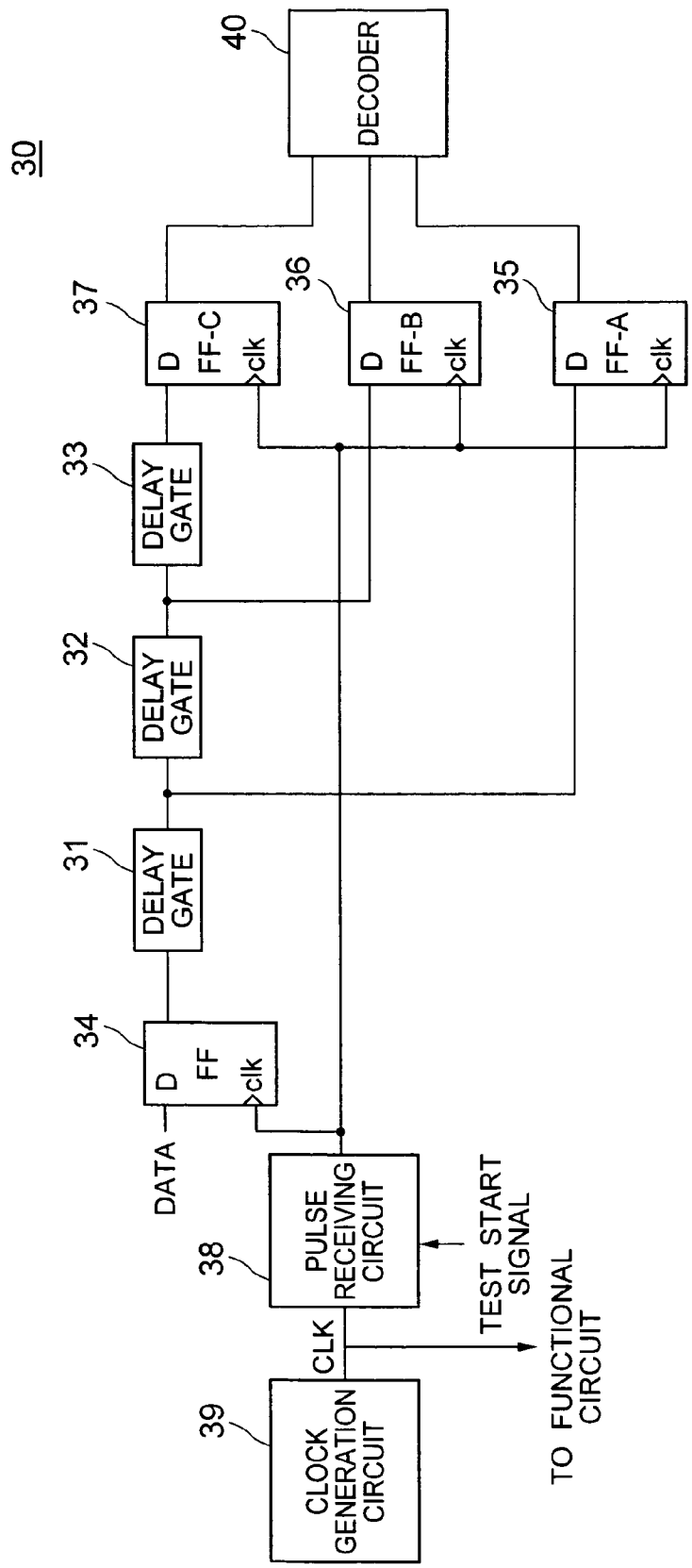
FIG. 6 is a block diagram showing a clock-signal test circuit used in a semiconductor device test method according to a second embodiment of the present invention.

FIG. 6 shows the configuration of a clock-signal test circuit used in a method for testing a semiconductor device according to a second embodiment of the present invention. The clock-signal test circuit 30 includes three delay circuits 31 to 33, a flip-flop (FF) 34 as a data transfer source, three judgement FFs including FF-A 35, FF-B 36 and FF-C 37, a pulse receiving circuit 38, and a decoder 40. The clock-signal test circuit 30 is provided in the semiconductor device having a clock generation circuit 39 which generates a clock signal supplied to each section in the semiconductor device. In a test of the semiconductor device, the clock-signal test circuit 30 is used to judge whether or not the period of the clock signal generated by the clock generation circuit 39 is within the range of a normal period.

The pulse receiving circuit 38 receives two consecutive pulses from the clock signal generated by the clock generation circuit 39. The data transfer source FF 34 receives therein data in synchrony with a rising edge of the first one of the pulses received by the pulse receiving circuit 38, and outputs the resultant data. The data input terminal of the first judgement FF-A (35) is connected to the output of the data transfer source FF 34 through the first delay circuit 31. The data input terminal of the second judgement FF-B (36) is connected to the output of the data transfer source FF 34 through the first and second delay circuits 31 and 32. The data input terminal of the third judgement FF-C (37) is connected to the output of the data transfer source FF 34 through the first to third delay circuits 31 to 33.

The decoder 40 is fed with the output of each of the judgement FF 35 to 37, and determines whether or not each judgement FF has been able to receive therein output data of the data transfer source FF 34. Delay time of each of the delay circuits 31 to 33 is set based on the normal frequency (normal period) of the clock signal and the allowable error margin thereof. More specifically, the delay time of the first delay circuit 31 is set to match the design clock period (T) minus the allowable error margin, based on the minimum period of the clock signal within the normal range. The delay time of the second delay circuit 32 is set at the design clock period (T) minus the delay time of the first delay circuit 31, resulting in the allowable error margin. The delay time of the third delay circuit 33 is set at a sum of the design clock period plus the allowable error margin minus a sum of the delay times of the first delay circuit 31 and the second delay circuit, resulting in the allowable error margin, based on the maximum period of the clock signal within the normal range.

For example, if a single period 1T of the clock signal is 10 ns and if the allowable error margin of the clock signal is ±10% (+1 ns) thereof, the delay time of the first delay circuit 31 is set at 10 ns−1 ns=9 ns, and the delay time of the second and third delay circuits 32 and 33 is set at 1 ns. In this case, the data input terminal of the first judgement FF-A 35 is fed with the output of the data transfer source FF 34 delayed by 9 ns. The data input terminal of the second judgement FF-B 36 is fed with the output of the data transfer source FF 34 delayed by 9 ns+1 ns=10 ns. The data input terminal of the third judgement FF-C 37 is fed with the output of the data transfer source FF 34 delayed by 9 ns+1 ns+1 ns=11 ns.

Figure 7:
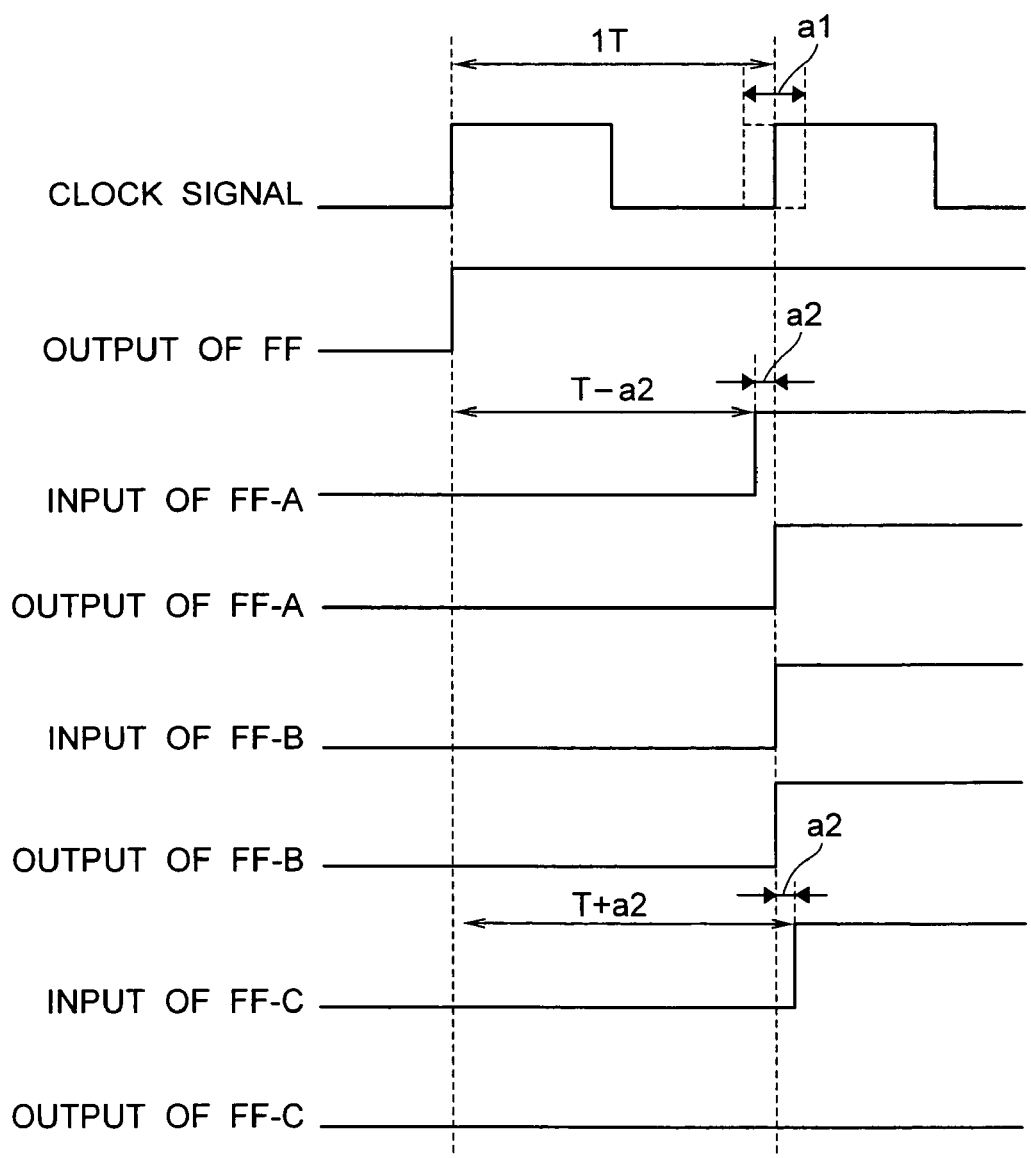
FIG. 7 is a timing chart showing the operation of each gate in the clock-signal test circuit.
Figure 8:
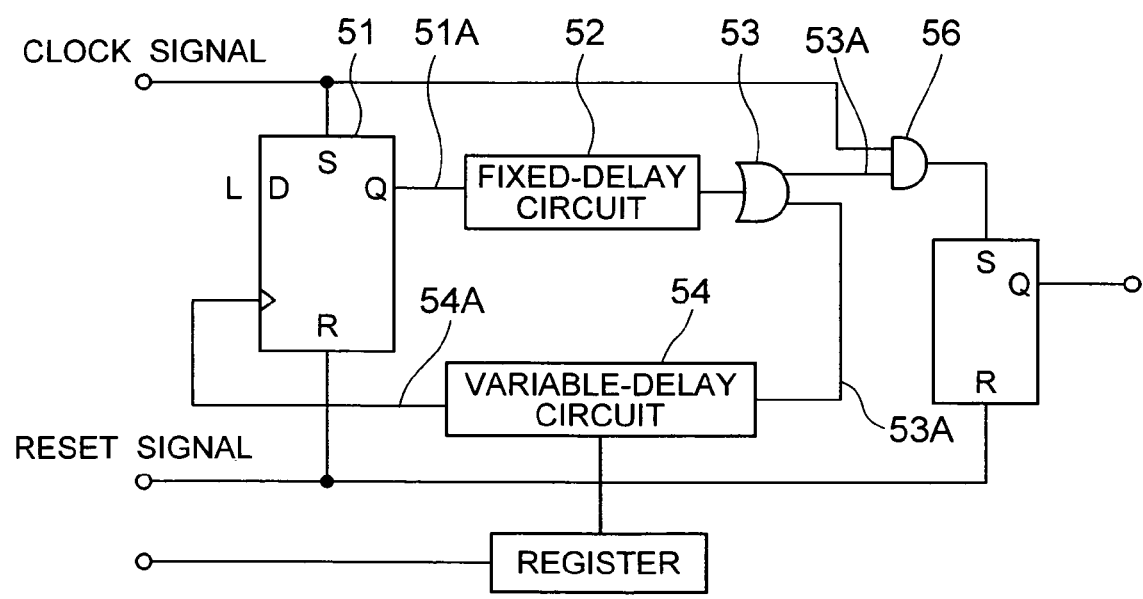
FIG. 8 is a block diagram showing the configuration of a conventional clock-period monitoring circuit.

FIG. 7 shows timing of each gate of the clock-signal test circuit 30. Upon reception of a test start signal, the pulse receiving circuit 38 receives therein two consecutive pulses, while keeping intact the frequency thereof, from the clock signal output from the clock generation circuit 39. The pulse receiving circuit 38 supplies the received pulses to the data transfer source FF 34 and each of the judgement FFs 35 to 37. The data transfer source FF 34 receives therein data in synchrony with a rising edge of the first one of the supplied pulses, and changes the output thereof to a H-level.

A signal input to the data input terminal of the first judgement FF-A 35 changes the output thereof to a H-level after the delay time of the first delay circuit 31, i.e., after the design period T minus the allowable error margin is elapsed since the change of the output of the data transfer source FF 34. Another signal input to the data input terminal of the second judgement FF-B 36 changes the output thereof to a H-level after elapse of the delay time of the second delay circuit 32 from the time instant at which the output of the FF 34 is changed, i.e., after the design period T of the clock signal is elapsed since the change of the output of the data transfer source FF 34. Further, another signal input to the data input terminal of the third judgement FF-C 37 changes the output thereof to a H-level further after elapse of the delay time of the third delay circuit 33, i.e., after the design period 1T plus the allowable error margin is elapsed since the change of the output of the data transfer source FF 34.

In FIG. 7, "a1" denotes a possible deviation from the design period T due to jitter caused by noise, and "a2" denotes an allowable error margin. Suppose that, if deviation a2 of the period 1T of the clock signal generated by the clock generation circuit 39 is within the allowable error margin a2, the judgement FFs 35 to 37 receive therein data at a timing of a rising edge of the second one of the pulses received by the pulse receiving circuit 38. Then, as shown in FIG. 7, the outputs of the first judgement FF-A 35 and the second judgement FF-B 36 change to a H-level. The output of the third judgement FF-C 37 does not change. Depending on the second pulse, the clock-signal test circuit 30 determines that the clock signal is normal if the first judgement FF-A 35 has been able to receive therein properly the data output from the data transfer source FF 34 and if the third judgement FF-C 37 has been unable to receive therein data output from the data transfer source FF 34.

Consideration will now be taken into the case that the period of the clock signal is longer than the predetermined range of the design period due to a jitter or the like. In this case, data receiving timing of the judgement FFs 35 to 37 will be delayed, compared with the case that the period of the clock signal is within the predetermined range of the design period. As described above, the output of the data transfer source FF 34 reaches the data input terminal of the third judgement FF-C 37 after the design period plus the allowable error margin is elapsed since the rising edge of the first pulse of the clock signal. Therefore, if the period of the clock signal is longer than the design period plus the allowable error margin, all the judgement FFs 35 to 37 receive therein properly data from the data transfer source FF 34. In this case, since the third judgement FF-C 37 receives therein properly data output from the data transfer source FF 34, the clock-signal test circuit 30 determines that the period of the clock signal is longer than the normal range, thereby judging that the clock signal has a defect.

On the other hand, if the period of the clock signal is shorter than the predetermined rage of the design period (1), the data receiving timing of the judgement FFs 35 to 37 will be sooner, compared with the case that the period of the clock signal is within the predetermined range of design period. In this case, if the period of the clock signal is shorter than the design period minus the allowable error margin, all the judgement FFs 35 to 37 receive therein data before the output of the data transfer source FF 34 reaches the data input terminal of the first judgement FF-A 35. Consequently, the judgement FFs 35 to 37 cannot receive therein data properly. Thus, if the first judgement FF-A 35 cannot properly receive therein data from the data transfer source FF 34, the clock-signal test circuit 30 determines that the period of the clock signal is shorter than the normal range, thereby judging that the clock signal has a defect.

In the present embodiment, the oscillation frequency of the clock signal is tested by investigating the outputs of the judgement FFs 35 to 37 in the semiconductor device. Therefore, the clock signal need not be extracted to any external connection pin to investigate the clock signal. Accordingly, the number of external connection pins of the semiconductor device can be reduced and the clock signal can be inspected without being influenced by the package noise or the like. Besides, neither a reference clock nor a sampling clock needs to be used to test the clock signal. Circuits are not required to generate these clocks, and terminals for inputting these clocks to the semiconductor device can be reduced.

In the first embodiment, the delay time of each delay gate 14 in FIG. 2 is set at 1T/N. However, the delay time of the delay circuits 14 need not necessarily be an identical value. For example, the delay time of the delay gate 14 in the first stage is set at 1T/2, and the delay time of the delay circuits in the second and following stages is set at 1T/N. In this case, the delay time of the delay gate 14 in the first stage extends longer than 1T/2 due to the influence of noise. However, if output data of the data transfer source FF0 (13) is transferred up to a delay measurement FF in a stage following to the second stage during a single period of the clock signal, the delay time can be measured by counting the number of those delay measurement FFs that have been able to receive therein the output of the data transfer source FF0.

Also in the first embodiment, the delay time is measured by investigating the number of stages of delay measurement FFs 15 to which the output of the data transfer source FF0 (13) is transferred during a single period of the clock signal. However, the present invention is not limited to this configuration. For example, the present invention may be configured as follows. When there is no influence of noise, the output data of the data transfer source FF0 (13) reaches a delay measurement FF[N] 15 in a N-th stage after elapse of a predetermined time length since the time instant of output of the data. After further elapse of the predetermined time after the data transfer source FF0 (13) outputs data, each delay measurement FF 15 latch gates input data. Meanwhile, the second embodiment has been described with respect to an example in which the data transfer source FF 34 outputs data to be transferred to the judgement FFs 35 to 37. In an alternative thereof, the configuration may be such that the first pulse of the clock signal is transferred to the judgement FFs 35 to 37.

Thus, the present invention has been described on the basis of preferred embodiments thereof. However, the semiconductor device test method and the semiconductor device according to the present invention are not limited to the embodiments described above. The scope of the present invention includes such configurations that can be derived from various corrections and modifications to the configurations of the embodiments.

What is claimed is:

1. A method for testing a semiconductor device comprising:

determining a relationship between an amount of noise generated in a noise generation circuit and a signal delay of a first delay circuit measured by a first delay measurement circuit in an evaluation semiconductor device (LSI), said noise generation circuit capable of generating a controlled amount of noise controlled from outside of said evaluation LSI, said first delay circuit having a delay time influenced by noise generated by said noise generation circuit;

measuring a signal delay of a second delay circuit by using a second delay measurement circuit in a device-under-test (DUT) LSI having a functional circuit upon operation of said functional circuit of said DUT LSI, said second delay circuit having a signal delay influenced by said functional circuit, said DUT LSI and said evaluation LSI being manufactured in a common process condition: and evaluating an amount of noise generated in said DUT LSI based on said relationship determined in said determining step and said signal delay detected by said second delay measurement circuit.

2. The method according to claim 1, wherein an operation voltage of said evaluation LSI is equal to an operation voltage of said DUT LSI.

3. The method according to claim 1, wherein said first and second delay measurement circuits include therein said first and second delay circuits, respectively.

4. The method according to claim 1, wherein each of said first and second delay circuits includes a plurality (N) of cascaded delay gates, wherein each of said first and second delay measurement circuit includes a test signal generation block for feeding a test signal to a corresponding one of said first and second delay circuits, and a plurality (N) of latch gates each receiving an output from a corresponding one of said cascaded delay gates, and wherein said signal delay measuring step includes the steps of feeding said test signal from said test signal generation circuit to said second delay circuit, and judging outputs of said latch gates latching outputs of respective said delay gates after a specified time length elapsed since the time of said test signal feeding.

5. The evaluation LSI measured by the method according to claim 1, wherein a plurality of said first delay measurement circuit is provided for a single said noise generation circuit.

6. The DUT LSI measured by the method according to claim 1, wherein a plurality of said second delay measurement circuit is provided for a single said functional circuit.

7. A method for testing a clock signal, comprising:

generating a test signal in response to a first clock pulse of the clock signal, to feed said test signal to first and second latch gates through data terminals thereof after providing first and second delays, respectively, to said test signal;

feeding a second clock pulse of the clock signal succeeding to said first clock pulse to said first and second latch gates through control terminals thereof, thereby allowing said first and second latch gates to latch said test signal delayed by said first and second delays, respectively; and investigating outputs of said first and second latch gates to judge pass or fail for an oscillation period of the clock signal.

8. A semiconductor device comprising:

a test signal generation circuit for receiving a first clock pulse of a clock signal to generate a test signal;

first delay gate for providing a first delay to said test signal, said first delay corresponding to an allowable shortest period of said clock signal;

a second delay gate for providing a second delay to said test signal, said second delay corresponding to a difference between an allowable longest period of said clock signal and said allowable shortest signal;

a first latch gate for latching an output of said first delay gate at a timing of a second clock pulse of said clock signal succeeding to said first clock pulse;

a second latch gate for latching an output of said second delay gate at the timing of said second clock pulse; and a judgement circuit for judging a period of said clock signal based on outputs of said first and second latch gates.

9. The semiconductor device according to claim 8, further comprising:

a third delay gate for providing a third delay to said test signal, said third delay corresponding to half said second delay; and a third latch gate for latching an output of said third delay gate at the timing of said second clock pulse.

\* \* \* \* \*